US011049851B2

(12) United States Patent
Hon et al.

(10) Patent No.: US 11,049,851 B2
(45) Date of Patent: Jun. 29, 2021

(54) METHOD AND SYSTEM FOR SELECTIVELY ILLUMINATED INTEGRATED PHOTODETECTORS WITH CONFIGURED LAUNCHING AND ADAPTIVE JUNCTION PROFILE FOR BANDWIDTH IMPROVEMENT

(71) Applicant: Luxtera, Inc., Carlsbad, CA (US)

(72) Inventors: Kam-Yan Hon, Oceanside, CA (US); Subal Sahni, La Jolla, CA (US); Gianlorenzo Masini, Carlsbad, CA (US); Attila Mekis, Carlsbad, CA (US)

(73) Assignee: Luxtera LLC, Wilmington, DE (US)

( * ) Notice: Subject to any disclaimer, the term of this patent is extended or adjusted under 35 U.S.C. 154(b) by 0 days.

(21) Appl. No.: 16/001,135

(22) Filed: Jun. 6, 2018

(65) Prior Publication Data

US 2018/0358342 A1 Dec. 13, 2018

Related U.S. Application Data

(60) Provisional application No. 62/516,949, filed on Jun. 8, 2017.

(51) Int. Cl.
*H01L 25/16* (2006.01)
*F21V 8/00* (2006.01)
*G02B 6/12* (2006.01)

(52) U.S. Cl.
CPC .......... *H01L 25/167* (2013.01); *G02B 6/0006* (2013.01); *G02B 6/12004* (2013.01);
(Continued)

(58) Field of Classification Search
None
See application file for complete search history.

(56) References Cited

U.S. PATENT DOCUMENTS 5,704,992 A * 1/1998 Willeke ................. B01D 29/07
136/255
7,085,443 B1 * 8/2006 Gunn, III ................ G02F 1/025
359/245
(Continued)

FOREIGN PATENT DOCUMENTS

EP 3029728 A1 6/2016
JP 2003142725 * 11/2001
JP 2003142725 * 5/2003

OTHER PUBLICATIONS

European Patent office Extended Search Report for Application No. PCT/US2018/036496 dated Apr. 2, 2021.
(Continued)

*Primary Examiner* — Nishath Yasmeen
(74) *Attorney, Agent, or Firm* — Patterson + Sheridan, LLP

(57) ABSTRACT

Methods and systems for selectively illuminated integrated photodetectors with configured launching and adaptive junction profile for bandwidth improvement may include a photonic chip comprising an input waveguide and a photodiode. The photodiode comprises an absorbing region with a p-doped region on a first side of the absorbing region and an n-doped region on a second side of the absorbing region. An optical signal is received in the absorbing region via the input waveguide, which is offset to one side of a center axis of the absorbing region; an electrical signal is generated based on the received optical signal. The first side of the absorbing region may be p-doped. P-doped and n-doped regions may alternate on the first and second sides of the absorbing region along the length of the photodiode. The absorbing region may comprise germanium, silicon, silicon/germanium, or similar material that absorbs light of a desired wavelength.

20 Claims, 10 Drawing Sheets

(52) U.S. Cl.
CPC .............................. *G02B 6/12007* (2013.01); *G02B 2006/12111* (2013.01); *G02B 2006/12126* (2013.01)

(56) References Cited

U.S. PATENT DOCUMENTS

| | | | | |
|---|---|---|---|---|
| 7,105,373 | B1* | 9/2006 | Hopper | H01L 31/028 257/465 |
| 7,397,101 | B1* | 7/2008 | Masini | H01L 31/028 257/184 |
| 7,418,166 | B1* | 8/2008 | Kapur | G02B 6/12007 216/2 |
| 8,872,294 | B2* | 10/2014 | Meade | H01L 31/02327 257/432 |
| 9,391,225 | B1* | 7/2016 | Davids | G02B 6/02 |
| 9,401,447 | B2* | 7/2016 | Okumura | G02B 6/1228 |
| 10,580,923 | B2* | 3/2020 | Simoyama | H01L 31/105 |
| 10,680,131 | B2* | 6/2020 | Huang | H01L 31/02327 |
| 2004/0017962 | A1* | 1/2004 | Lee | G02B 6/4201 385/14 |
| 2007/0104410 | A1* | 5/2007 | Ahn | H01L 31/028 385/14 |
| 2008/0272391 | A1* | 11/2008 | Kapur | H01L 31/1085 257/103 |
| 2012/0235265 | A1 | 9/2012 | Takabayashi | |
| 2014/0054736 | A1 | 2/2014 | Meade et al. | |
| 2014/0070082 | A1* | 3/2014 | Guo | G01N 21/59 250/227.14 |
| 2014/0138787 | A1* | 5/2014 | Hellings | H01L 31/022408 257/432 |

OTHER PUBLICATIONS

Solomon Assefa et al."CMOS-Integrated Optical Recivers for On-Chip Interconnects", IEEE Hournal of Selected Topics in Quantum Electronics, vol. 16, 16, No. 5, Sep. 1, 2010, pp. 1376-1385.
International Search Report for Application PCT/US2018/036496, dated Sep. 26, 2018.

* cited by examiner

METHOD AND SYSTEM FOR SELECTIVELY ILLUMINATED INTEGRATED PHOTODETECTORS WITH CONFIGURED LAUNCHING AND ADAPTIVE JUNCTION PROFILE FOR BANDWIDTH IMPROVEMENT

CROSS-REFERENCE TO RELATED APPLICATIONS/INCORPORATION BY REFERENCE

This application claims priority to and the benefit of U.S. Provisional Application 62/516,949 filed on Jun. 8, 2017, which is hereby incorporated herein by reference in its entirety.

FIELD

Aspects of the present disclosure relate to electronic components. More specifically, certain implementations of the present disclosure relate to methods and systems for selectively illuminated integrated photodetectors with configured launching and adaptive junction profile for bandwidth improvement.

BACKGROUND

Conventional approaches for integrated photodetectors may be costly, cumbersome, and/or inefficient—e.g., they may be complex and/or time consuming, and/or may have limited responsivity due to losses.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for selectively illuminated integrated photodetectors with configured launching and adaptive junction profile for bandwidth improvement, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y". As another example, "x, y, and/or z" means any element of the seven-element set $\{(x), (y), (z), (x, y), (x, z), (y, z), (x, y, z)\}$. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry or a device is "operable" to perform a function whenever the circuitry or device comprises the necessary hardware and code (if any is necessary) to perform the function, regardless of whether performance of the function is disabled or not enabled (e.g., by a user-configurable setting, factory trim, etc.).

Figure 1A:
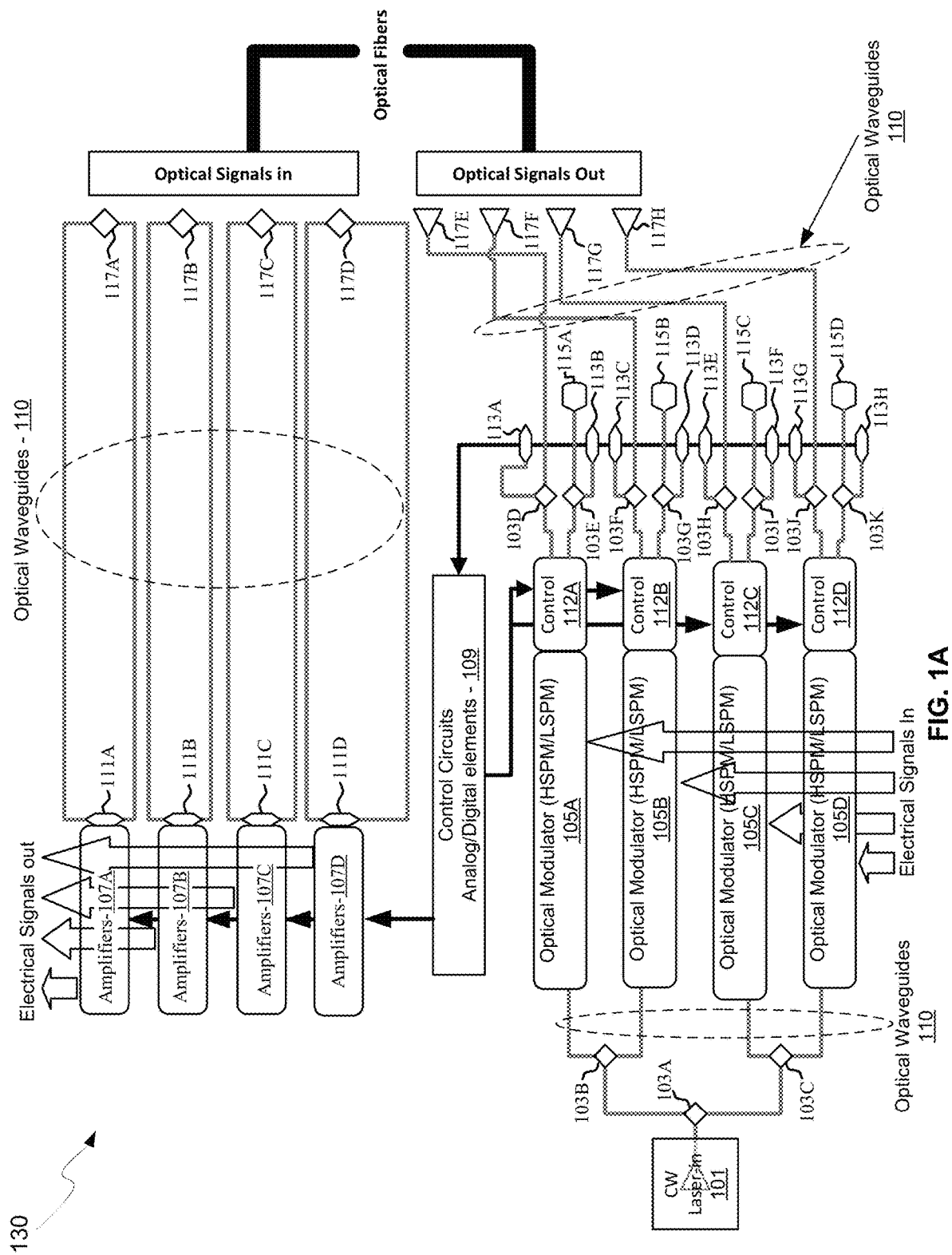
FIG. 1A is a block diagram of a photonically-enabled integrated circuit with selectively illuminated integrated photodetectors, in accordance with an example embodiment of the disclosure.

FIG. 1A is a block diagram of a photonically-enabled integrated circuit with selectively illuminated integrated photodetectors, in accordance with an example embodiment of the disclosure. Referring to FIG. 1A, there is shown optoelectronic devices on a photonically-enabled integrated circuit 130 comprising optical modulators 105A-105D, photodiodes 111A-111D, monitor photodiodes 113A-113H, and optical devices comprising couplers 103A-103K, optical terminations 115A-115D, grating couplers 117A-117H, and mode converters 121. There are also shown electrical devices and circuits comprising amplifiers 107A-107D, analog and digital control circuits 109, and control sections 112A-112D. The amplifiers 107A-107D may comprise transimpedance and limiting amplifiers (TIA/LAs), for example.

In an example scenario, the photonically-enabled integrated circuit 130 comprises a complementary metal oxide semiconductor (CMOS) photonics die with a laser assembly 101 coupled to the top surface of the IC 130. The laser assembly 101 may comprise one or more semiconductor lasers with isolators, lenses, and/or rotators for directing one or more CW optical signals to the coupler 103A. The photonically enabled integrated circuit 130 may comprise a single chip, or may be integrated on a plurality of die, such as one or more electronics die and one or more photonics die.

Optical signals are communicated between optical and optoelectronic devices via optical waveguides 110 fabricated in the photonically-enabled integrated circuit 130. Single-mode or multi-mode waveguides may be used in photonic integrated circuits. Single-mode operation enables direct connection to optical signal processing and networking elements. The term "single-mode" may be used for waveguides that support a single mode for each of the two polarizations, transverse-electric (TE) and transverse-magnetic (TM), or for waveguides that are truly single mode and only support one mode whose polarization is TE, which comprises an electric field parallel to the substrate supporting the waveguides. Two typical waveguide cross-sections that are utilized comprise strip waveguides and rib waveguides. Strip waveguides typically comprise a rectangular cross-section, whereas rib waveguides comprise a rib section on top of a waveguide slab. Of course, other waveguide cross section types are also contemplated and are within the scope of the disclosure.

In an example scenario, the couplers 103A-103C may comprise low-loss Y-junction power splitters where coupler 103A receives an optical signal from the laser assembly 101 and splits the signal to two branches that direct the optical signals to the couplers 103B and 103C, which split the optical signal once more, resulting in four roughly equal power optical signals.

The optical modulators 105A-105D comprise Mach-Zehnder or ring modulators, for example, and enable the modulation of the continuous-wave (CW) laser input signal. The optical modulators 105A-105D may comprise high-speed and low-speed phase modulation sections and are controlled by the control sections 112A-112D. The high-speed phase modulation section of the optical modulators 105A-105D may modulate a CW light source signal with a data signal. The low-speed phase modulation section of the optical modulators 105A-105D may compensate for slowly varying phase factors such as those induced by mismatch between the waveguides, waveguide temperature, or waveguide stress. Compensating for these slowly varying phase factors is referred to as the passive phase, or the passive biasing of the Mach-Zehnder Modulator (MZM).

The outputs of the optical modulators 105A-105D may be optically coupled via the waveguides 110 to the grating couplers 117E-117H. The couplers 103D-103K may comprise four-port optical couplers, for example, and may be utilized to sample or split the optical signals generated by the optical modulators 105A-105D, with the sampled signals being measured by the monitor photodiodes 113A-113H. The unused branches of the directional couplers 103D-103K may be terminated by optical terminations 115A-115D to avoid back reflections of unwanted signals.

The grating couplers 117A-117H comprise optical gratings that enable coupling of light into and out of the photonically-enabled integrated circuit 130. The grating couplers 117A-117D may be utilized to couple light received from optical fibers into the photonically-enabled integrated circuit 130, and the grating couplers 117E-117H may be utilized to couple light from the photonically-enabled integrated circuit 130 into optical fibers. The grating couplers 117A-117H may comprise single polarization grating couplers (SPGC) and/or polarization splitting grating couplers (PSGC). In instances where a PSGC is utilized, two input, or output, waveguides may be utilized.

Grating couplers are devices in integrated optical circuits that interface light between telecommunication fibers and optical circuits. They comprise surface emitting elements that diffract guided light out of the plane of the circuit, where it can be collected with standard optical fibers. In contrast to other coupling methods, such as end-face coupling, grating couplers lend themselves to planar fabrication methods and allow free placement of optical interfaces on the chip surface.

Figure 1B:
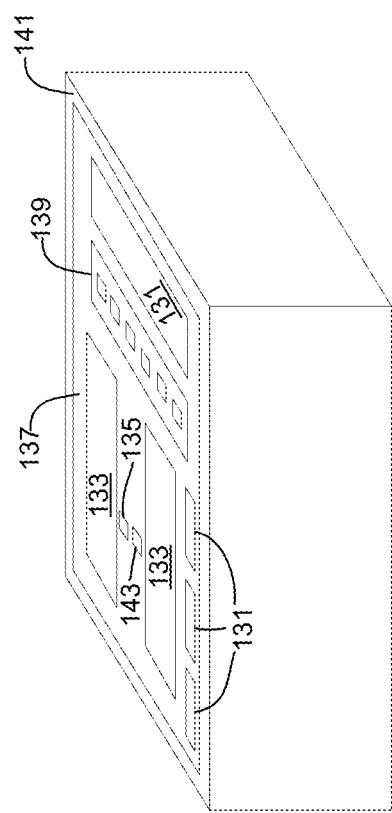
FIG. 1B is a diagram illustrating an exemplary photonically-enabled integrated circuit, in accordance with an example embodiment of the disclosure.
Figure 1B:
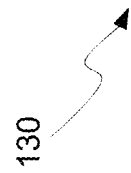

In another exemplary embodiment illustrated in FIG. 1B, optical signals may be communicated directly into the surface of the photonically-enabled integrated circuit 130 without optical fibers by directing a light source on an optical coupling device in the chip, such as the light source interface 135 and/or the optical fiber interface 139. This may be accomplished with directed laser sources and/or optical sources on another chip flip-chip bonded to the photonically-enabled integrated circuit 130.

The photodiodes 111A-111D may convert optical signals received from the grating couplers 117A-117D into electrical signals that are communicated to the amplifiers 107A-107D for processing. In another embodiment of the disclosure, the photodiodes 111A-111D may comprise high-speed heterojunction phototransistors, for example, and may comprise germanium (Ge) in the absorbing region for absorption in the 1.3-1.6 μm optical wavelength range, and may be integrated on a CMOS silicon-on-insulator (SOI) wafer, for example.

As the speeds of optoelectronic transmitters increase, photodetector speed must be improved for overall system performance. In an example embodiment of the disclosure, selectively illuminated integrated photodetectors with launching and adaptive junction profile for bandwidth improvement are described for receiving optical signals from a plurality of waveguides, as shown further with respect to FIGS. 2-8.

In an example embodiment of the disclosure, integrated photodiode bandwidth may be improved by selectively illuminating only the high speed portion of the absorbing active core. This can be achieved using an asymmetric light launching condition. In addition, bandwidth may be further improved using an adaptive doping/junction profile to ensure that the launched light overlaps only with the high speed portion of the detector along the propagation direction.

In another example embodiment, the four transceivers shown in FIG. 1A may be incorporated in two or more chips, as opposed to the single chip shown. For example, the electronics devices, such as the control circuits 109 and the amplifiers/TIAs 107A-107D, may be fabricated in an electronics CMOS die while the optical and optoelectronic devices, such as the photodetectors 111A-111D, grating couplers 117A-117H, and the optical modulators 105A-105D may be incorporated on a photonics die, such as a silicon photonics interposer.

The analog and digital control circuits 109 may control gain levels or other parameters in the operation of the amplifiers 107A-107D, which may then communicate electrical signals off the photonically-enabled integrated circuit 130. The control sections 112A-112D comprise electronic circuitry that enable modulation of the CW laser signal received from the splitters 103A-103C. The optical modulators 105A-105D may require high-speed electrical signals to modulate the refractive index in respective branches of a MZM, for example.

In operation, the photonically-enabled integrated circuit 130 may be operable to transmit and/or receive and process optical signals. Optical signals may be received from optical fibers by the grating couplers 117A-117D and converted to electrical signals by the photodetectors 111A-111D. The electrical signals may be amplified by transimpedance amplifiers in the amplifiers 107A-107D, for example, and subsequently communicated to other electronic circuitry, not shown, in the photonically-enabled integrated circuit 130.

Integrated photonics platforms allow the full functionality of an optical transceiver to be integrated on a single chip. An optical transceiver chip contains optoelectronic circuits that create and process the optical/electrical signals on the transmitter (Tx) and the receiver (Rx) sides, as well as optical interfaces that couple the optical signals to and from a fiber. The signal processing functionality may include modulating the optical carrier, detecting the optical signal, splitting or combining data streams, and multiplexing or demultiplexing data on carriers with different wavelengths.

Typically, the p-i-n junction of a waveguide photodiode is orientated in a lateral direction and the intrinsic width, which is usually the width of the absorbing region, is defined by photolithography. This type of design is commonly used because of its fabrication simplicity. Although the length of the photodiode is short and therefore results in a lower capacitance, the intrinsic width of the absorbing region is limited to ~500 nm due to lithography issues, which means that this type of junction photodiode is transit-time-limited. On the other hand, a vertical p-i-n photodiode is limited by the absorbing layer thickness, which is determined by the deposition process, and can be easily go down below 500 nm. The bandwidth can then be higher and not transit-time-limited. However, a vertical junction utilizes a more complex contact scheme which either (1) increases fabrication complexity or (2) contact resistance. Other design options are to vary the doping profile to reduce the effective Ge intrinsic width, e.g. making the p-i-n junction more vertical-like. In an example scenario, the absorbing region comprises germanium, but may comprise other materials such as silicon, silicon-germanium, or other semiconductor that absorbs light at the desired wavelength.

In an example embodiment of the disclosure, an alternative method which is an optical approach, is described to increase bandwidth without adding process complexity to the existing process technology. Examples of the proposed approach applied to actual fabricated devices are shown in FIGS. 2-8.

FIG. 1B is a diagram illustrating an exemplary photonically-enabled integrated circuit, in accordance with an example embodiment of the disclosure. Referring to FIG. 1B, there is shown the photonically-enabled integrated circuit 130 comprising electronic devices/circuits 131, optical and optoelectronic devices 133, a light source interface 135, a chip front surface 137, an optical fiber interface 139, CMOS guard ring 141, and a surface-illuminated monitor photodiode 143.

The light source interface 135 and the optical fiber interface 139 comprise grating couplers, for example, that enable coupling of light signals via the CMOS chip surface 137. Coupling light signals via the chip surface 137 enables the use of the CMOS guard ring 141 which protects the chip mechanically and prevents the entry of contaminants via the chip edge.

The electronic devices/circuits 131 comprise circuitry such as the amplifiers 107A-107D and the analog and digital control circuits 109 described with respect to FIG. 1A, for example. The optical and optoelectronic devices 133 comprise devices such as the couplers 103A-103K, optical terminations 115A-115D, grating couplers 117A-117H, optical modulators 105A-105D, high-speed heterojunction photodiodes 111A-111D, and monitor photodiodes 113A-113I.

Figure 1C:
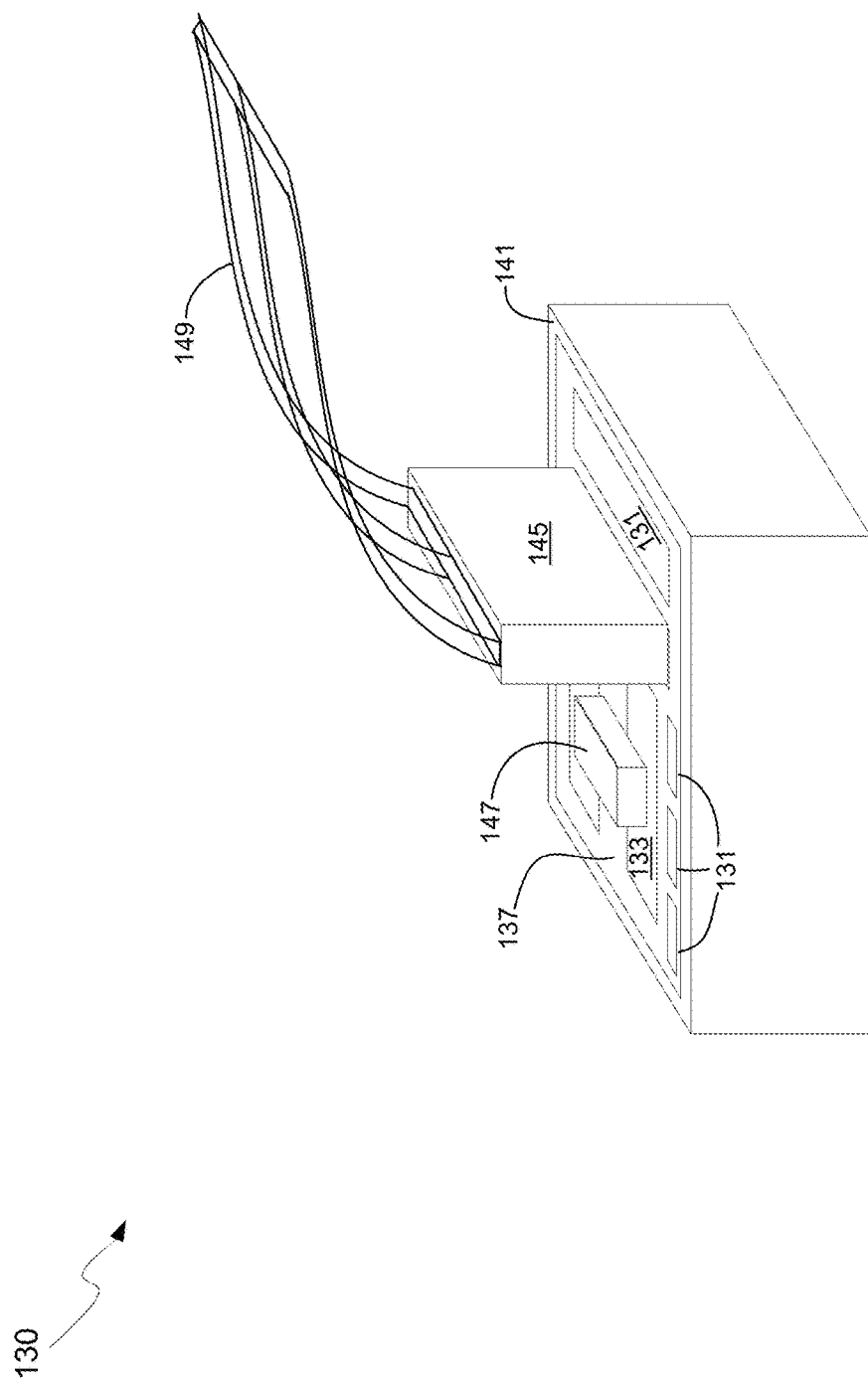
FIG. 1C is a diagram illustrating a photonically-enabled integrated circuit coupled to an optical fiber cable, in accordance with an example embodiment of the disclosure.

FIG. 1C is a diagram illustrating a photonically-enabled integrated circuit coupled to an optical fiber cable, in accordance with an example embodiment of the disclosure. Referring to FIG. 1C, there is shown the photonically-enabled integrated circuit 130 comprising the chip surface 137, and the CMOS guard ring 141. There is also shown a fiber-to-chip coupler 145, an optical fiber cable 149, and an optical source assembly 147.

The photonically-enabled integrated circuit 130 comprises the electronic devices/circuits 131, the optical and optoelectronic devices 133, the light source interface 135, the chip surface 137, and the CMOS guard ring 141 may be as described with respect to FIG. 1B, for example.

In an example embodiment, the optical fiber cable may be affixed, via epoxy for example, to the CMOS chip surface 137. The fiber chip coupler 145 enables the physical coupling of the optical fiber cable 149 to the photonically-enabled integrated circuit 130. In another example scenario, the IC 130 may comprise photonic devices on one die, such as a photonics interposer, and electrical devices on an electronics die, both of which may comprise CMOS die.

Figure 2A:
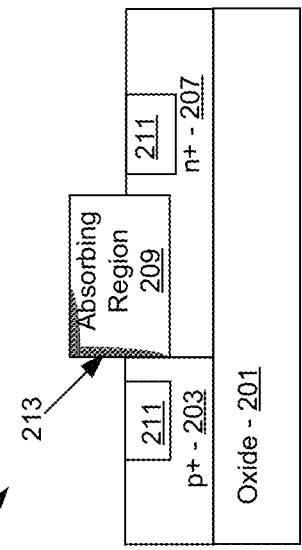
FIGS. 2A and 2B illustrate two examples of integrated photodetectors, in accordance with an example embodiment of the disclosure.
Figure 2B:
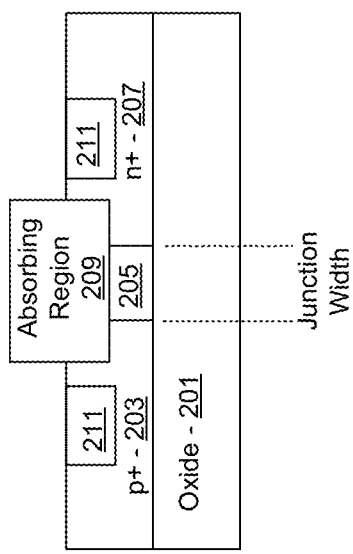

FIGS. 2A and 2B illustrate two examples of integrated photodetectors, in accordance with an example embodiment of the disclosure. An example standard waveguide photodetector is based on an absorbing germanium (Ge) layer grown on a silicon waveguide, although other materials are possible. Referring to FIG. 2A, there is shown integrated photodiode 200 comprising oxide layer 201, which is on a silicon layer (not shown) in a typical SOI wafer, p+ region 203, intrinsic region 205, n+ region 207, absorbing region 209, and trench 211.

The intrinsic width of the photodiode 200 in this case is the width of the absorbing region 209. A typical p-i-n integrated photodiode is symmetric, as shown in FIG. 2A, except the doping type is different on the right (n+ region 207) and left (p+ region 203) sides. For a transit-time-limited device, the bandwidth is limited by the travelling time of electrons or holes, whichever are slower from the absorbing region in the absorbing region 209 to the contacts at the high doped p+ and n+ regions. In instances where Ge is used for the absorbing region 209, the mobility of electrons is much higher than holes in bulk Ge. Similarly for Ge-on-Si, the bandwidth is limited by holes, so holes that are generated near the n-doped side (right side) of the diode therefore take the longest time to be swept out from right to left, while higher mobility electrons are more quickly swept out to the n+ region 207. This suggests that carriers generated at different parts of the absorbing core can be swept out quite differently. This same concept applies for other materials where holes and electrons have different mobility.

FIG. 2B illustrates a vertical-like photodiode 250 comprising oxide layer 201, p+ region 203, n+ region 207, absorbing region 209, trench 211, and p+ region 213. In this structure, the absorbing region 209 is also undoped except in the upper left corner and left edge, in the p+ region 213, meaning photo-generated carriers may be swept out in an essentially vertical direction, where the absorbing region 209 thickness can be very thin, determined by the deposition technique. In this manner, carriers generated in the absorbing region 209 merely need to be swept downward through the thickness of the absorbing region 209.

In an example scenario, the diodes shown in FIGS. 2A and 2B may comprise double heterostructures where the p+ and n+ regions are silicon and the absorbing region 209 comprises germanium, although the disclosure is not so limited as other junctions are possible, such as homojunctions, a single heterojunction, or multiple junctions. Accordingly, the n-doped, p-doped regions, and absorbing region 209 may all comprise Ge or Si (or other suitable material) for a homojunction, or Si and Ge for a heterojunction, for example. Furthermore, while germanium or silicon is shown in this example for the absorbing region 209, silicon-germanium or other materials that absorb optical signals at a desired wavelength may be utilized.

Figures 3A, 3B:
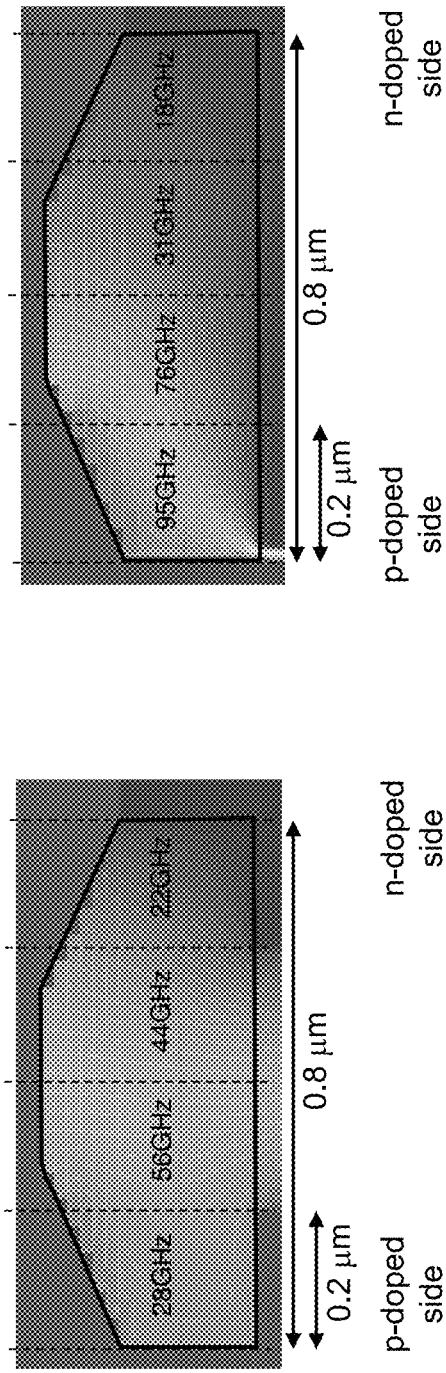
FIGS. 3A and 3B illustrate calculated bandwidths for various portions of a germanium photodiode, in accordance with an example embodiment of the disclosure.

FIGS. 3A and 3B illustrate calculated bandwidths for various portions of a germanium photodiode, in accordance with an example embodiment of the disclosure. The bandwidth indicated in each portion is the bandwidth of the detector assuming light is only absorbed on that portion. FIG. 3A shows the undoped absorbing region divided into four portions laterally for the lateral p-i-n photodetector 200 of FIG. 2A. The center two portions have a much higher bandwidth but the overall device speed, when uniformly illuminated, is limited by the time required to sweep out carriers near the n-doped side, due to the slower holes, resulting in an overall bandwidth of the device of only 32 GHz. In a vertical-like p-i-n integrated photodiode as shown in FIG. 2B, and bandwidth in FIG. 3B, the situation is different owing to the quasi-vertical orientation of the electric field.

FIG. 3B shows the bandwidth of each portion of the absorbing region for a vertical-like photodiode as shown by photodetector 250 in FIG. 2B. In this example, the absorbing region is germanium and the contact layers are silicon, although other materials are possible for this structure. The left two portions of the device have a much higher bandwidth of 76 GHz and 95 GHz, respectively, whereas the overall bandwidth of the device is only 23 GHz if fully illuminated. Therefore, by controlling where the optical signal is launched and absorbed into the photodiode, speed may be greatly increased as compared to a device where the light impinges on the entire absorbing structure. While a Ge—Si heterostructure is use for this example, other materials and structures may be utilized.

Asymmetric launching for increased bandwidth comprises illuminating light only onto the high speed portions. To achieve this, a waveguide offset may be utilized to direct light straight into the selected absorbing region where speed is highest, as compared to a conventional waveguide which is aligned to the center of the diode. Since light is strongly absorbed by Ge, for example, the waveguide offset does not greatly affect the responsivity. Depending on the optical propagation and absorption length, the bandwidth may be improved without adding any process complexity. For example, the bandwidth achievable by illuminating the left two portions of Ge of a vertical-like p-i-n photodiode shown in FIG. 3B is very high, 76 and 95 GHz. Therefore, the input waveguide may be offset from the center and directly coupled to the left side (p-doped side) of the diode to gain speed.

Figure 4:
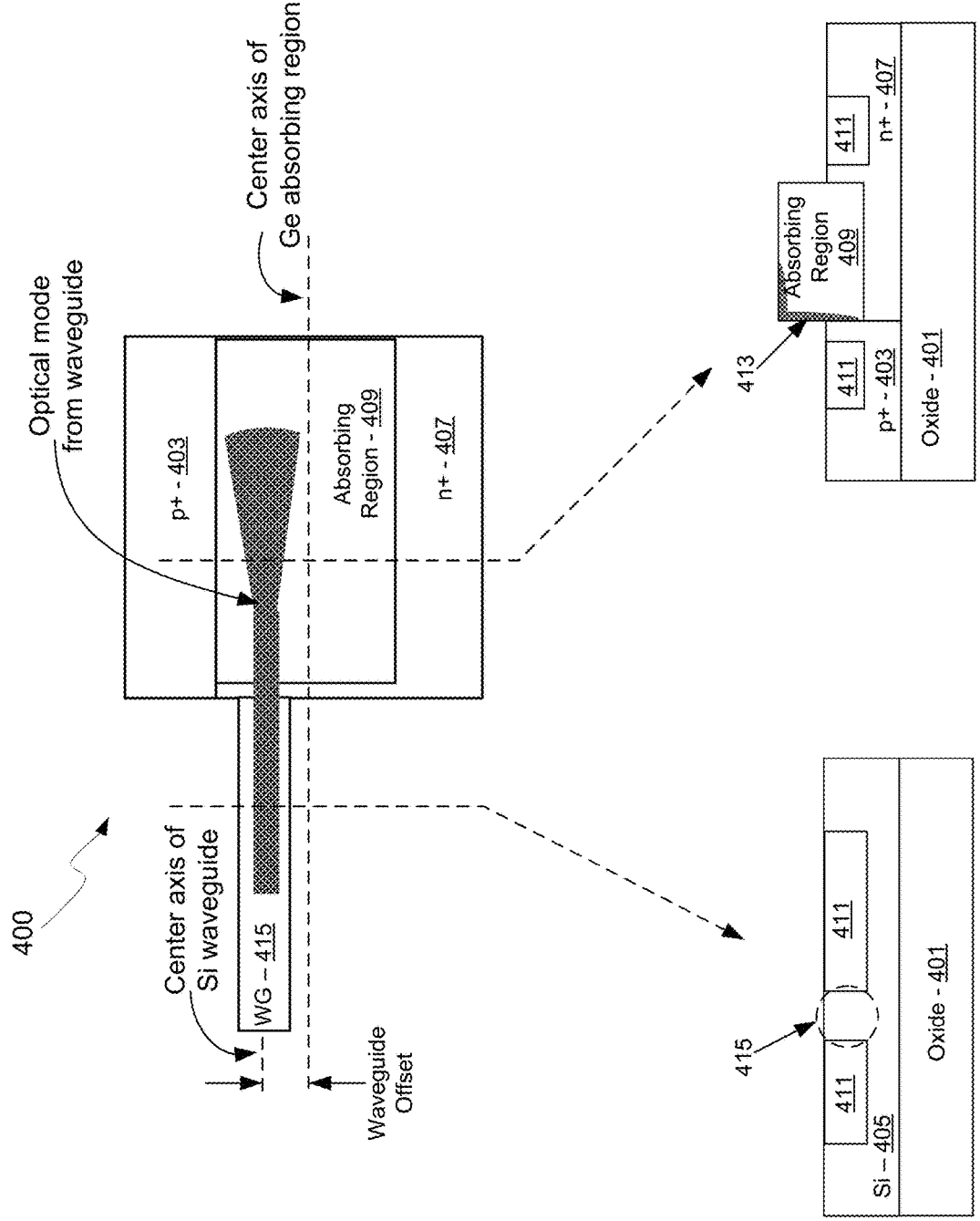
FIG. 4 illustrates top and cross-section views of a photodiode with asymmetric launching, in accordance with an example embodiment of the disclosure.

FIG. 4 illustrates top and cross-section views of a photodiode with asymmetric launching, in accordance with an example embodiment of the disclosure. Referring to FIG. 4, there is shown photodetector 400 comprising oxide layer 401, p+ region 403, n+ region 407, absorbing region 409, trench 411, p+ region 413, and waveguide 415. The waveguide 415 comprises the portion of a Si layer 405, for example, although other materials are possible, between the trenches 411. In addition, in this example, the absorbing region 409 may comprise Ge, although other materials are of course possible. The trenches 411 provide an index of refraction change from the Si layer 405 so that optical signals may be confined in the waveguide 415. The trenches 411 comprise regions where the Si layer 405 has been removed and either filled with oxide or other dielectric, or left unfilled for an air/silicon index of refraction difference.

The dashed lines indicate where in the upper view the cross-sectional views below correspond. Accordingly, the lower left view shows a cross sectional view of the waveguide 415 and the lower right view shows a cross-sectional view of the photodetector 400. The lower left portion of FIG. 4 illustrates a cross-section of the input waveguide with a wider trench 411 on the right side as compared to the left, resulting in the input waveguide 415 being offset to the left of center (or above center in the top view) of the Ge absorbing layer, as indicated by the Waveguide Offset.

The light incident on the absorbing region 409 from a Si single mode waveguide 415 is expected to spread out in a short distance, as indicated by the expanding optical mode in the absorbing region 409. However, in an example scenario where Ge is used as the absorbing region 409, a large portion of the light (~95%) is absorbed in Ge within the first 5 μm of propagation distance.

The lower right view of FIG. 4 shows a cross section of the photodiode with a vertical-like p-i-n structure, as shown in FIG. 2B, for example. Since the bandwidth is highest in the left two quadrants of the absorbing layer 409 for this structure, as shown in FIG. 3B, the input waveguide 415 is offset to align to this higher bandwidth portion, increasing the overall bandwidth of the photodiode.

In this manner, the bandwidth of the photodiode 400 may be configured by the waveguide offset, where different doping configurations may result in different locations of maximum bandwidth in the absorbing region 409. While double heterostructure diodes are shown in FIG. 4, the disclosure is not so limited as other junctions are possible, such as homojunctions, a single heterojunction, or multiple junctions. Furthermore, while germanium or silicon is shown in this example for the absorbing region 409, silicon-germanium or other materials that absorb optical signals at a desired wavelength may be utilized.

Figure 5:
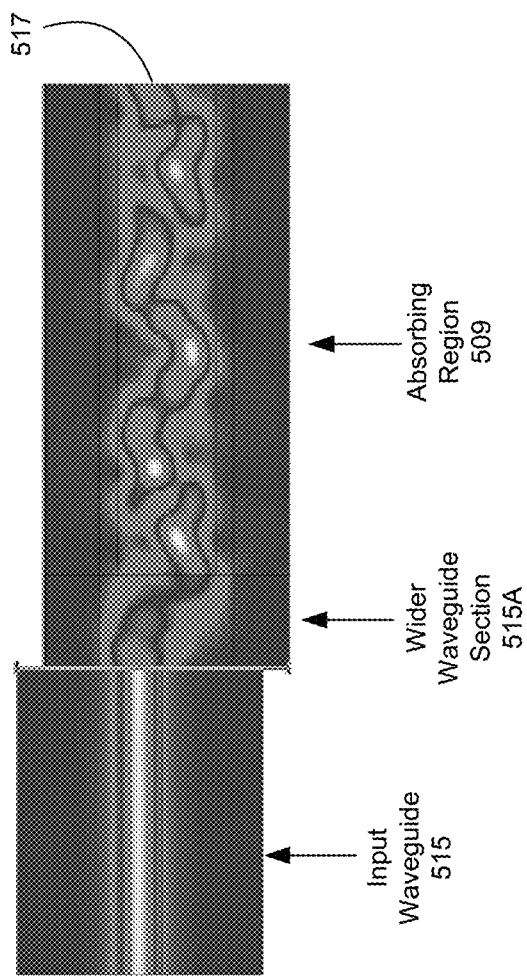
FIG. 5 shows the top view power profile of a photodiode with asymmetric launching, in accordance with an example embodiment of the disclosure.

FIG. 5 shows the top view optical power profile of a photodiode with asymmetric launching, in accordance with an example embodiment of the disclosure. Referring to FIG. 5, there is shown an input waveguide 515, a wider waveguide section 515A, and an absorbing region 509. There is also shown optical power profile 517 in the absorbing region 509, where the profile is shown for light being incident on the absorbing region 509 with a waveguide offset oriented above the center of the absorbing region 509, which in this example comprises Ge. This launching condition shows that light is actually bouncing back and forth in the absorbing region 509 and optical power stays at one side of the absorbing region 509 and then the other side half in every period. In an example scenario, where the p-i-n photodiode comprises a Si—Ge double heterostructure, this periodic pattern is the result of beating of the different modes excited in the Ge/Si waveguide by the asymmetric launching condition. The actual phase of the beating pattern can be controlled by an appropriate launching condition Maximum benefit for the bandwidth can be achieved if the light stays as long as possible, in propagation, on the fast side of the device. In fact, where Ge is used for the absorbing region 509, since the absorption of Ge is very high, after the first half beating period most of the light might be already absorbed. Therefore controlling the phase of the beating pattern is key to maximize the bandwidth enhancement benefit. The phase of the beating pattern can be adjusted either by varying the waveguide launching angle or by adding a wider waveguide, the wider waveguide section 515A between the input waveguide 515 and the absorbing region 509, as shown in FIG. 5. In this case, most of the light absorbed in the first half section stays on the absorbing portion with higher bandwidth, i.e., the upper two quadrants of the wider waveguide section 515A, which improves the overall bandwidth.

Figure 6:
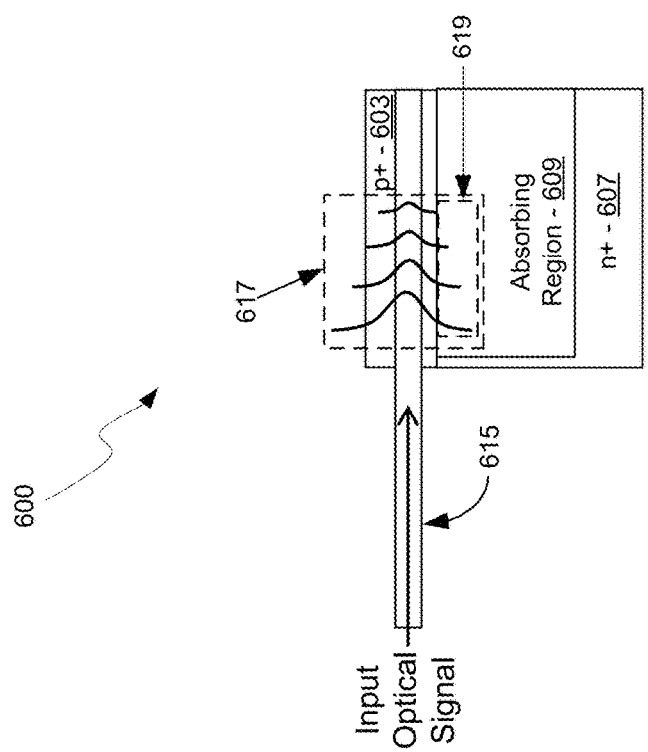
FIG. 6 illustrates a photodiode with evanescent coupling, in accordance with an example embodiment of the disclosure.

FIG. 6 illustrates a photodiode with evanescent coupling, in accordance with an example embodiment of the disclosure. Referring to FIG. 6, there is shown photodetector 600 comprising a p+ region 603, n+ region 607, absorbing region 609, and input waveguide 615. There is also shown optical mode 617 in the waveguide 615 after reaching the photodetector 600, with an evanescent portion 619 that extends into the absorbing region 609. In an example scenario, the absorbing region comprises Ge and the p+ and n+ regions comprise silicon, although other materials are possible.

Evanescent coupling is another technique to achieve an asymmetric launching condition where the input optical wave propagates in a very close parallel waveguide 615, as shown in FIG. 6. Optical modes are not completely confined to waveguides in which they are traveling, with a portion of the signal comprising evanescent waves that extend beyond the waveguide edge. In this case, the waveguide 615 may be highly doped to maintain good contact resistance but the propagation length is short as light may be strongly absorbed by Ge with a strong evanescent coupling structure. Furthermore, while germanium or silicon is shown in this example for the absorbing region 509, silicon-germanium or other materials that absorb optical signals at a desired wavelength may be utilized.

Figure 7:
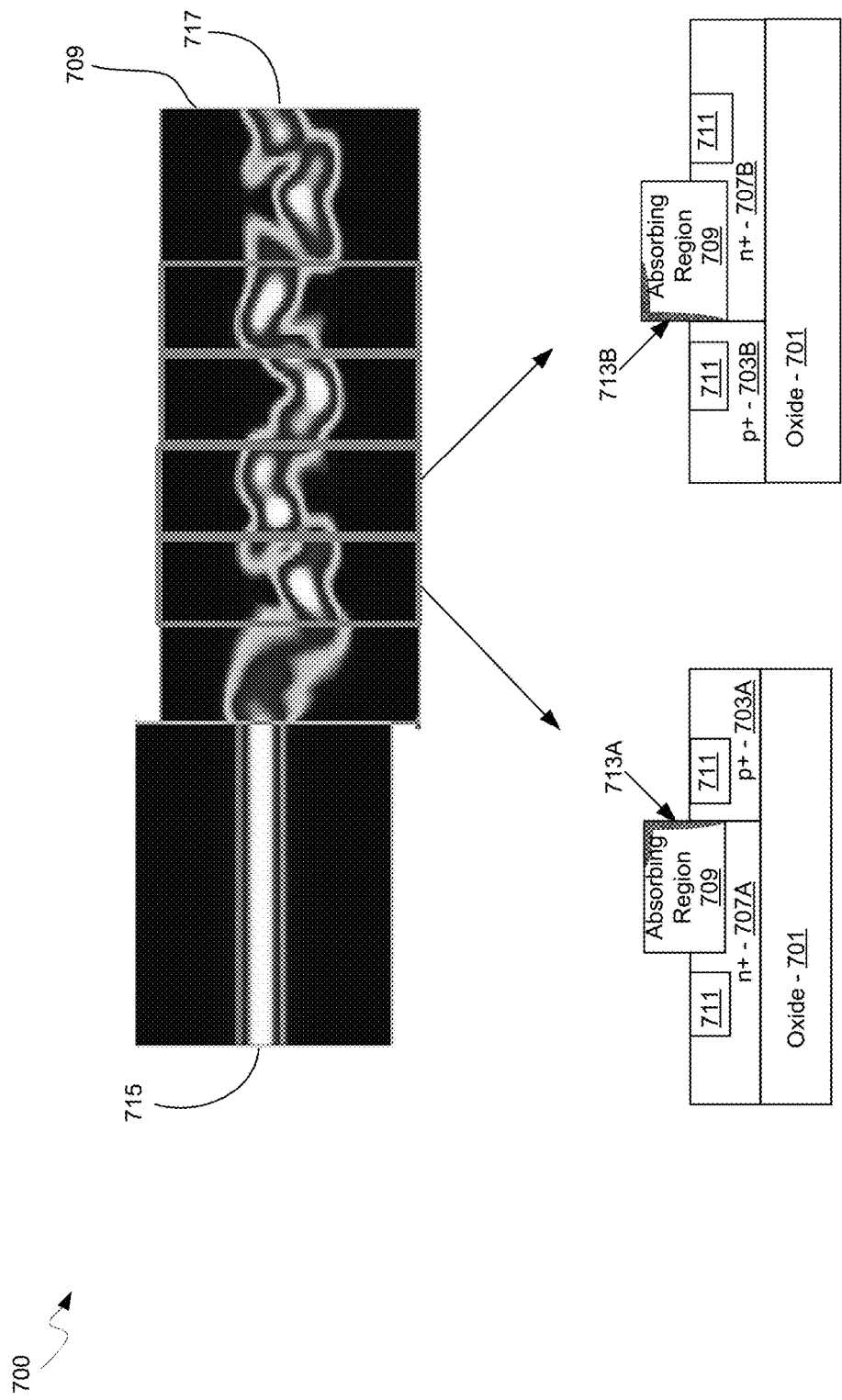
FIG. 7 illustrates a photodiode with alternating n-type and p-type doping, in accordance with an example embodiment of the disclosure.

FIG. 7 illustrates an integrated photodiode with alternating n-type and p-type doping, in accordance with an example embodiment of the disclosure. Referring to FIG. 7, there is shown top and cross-sectional views of photodetector 700 comprising oxide layer 701, alternating p+ regions 703A and 703B, alternating n+ regions 707A and 707B, absorbing region 709, and alternating absorbing p+ regions 713A and 713B. The top view shows the optical power profile 717 as it proceeds through the absorbing region 709 on one side and then the other half, in every period. In an example scenario, the absorbing region 709 comprises Ge. In this case, the light coupled in the absorbing region 709 shows a beating pattern with the power confined in a much narrower width than the absorbing region 709 width. The doping profile may be varied and/or alternated along the propagation distance such that the high speed Ge portions, in this example, always overlap with the area where high optical power is localized. This adaptive junction profile can be achieved by a) flipping the n and p side every half of the beating period, and/or b) varying the doping profile along with the beating pattern.

The lower cross-sectional views, indicated by the arrows from different boxed regions, shows this flipping of the n and p side every half beating period so that the optical power is always at the higher speed portion of the absorbing region 709 (e.g., the p-doped side). This configuration might have higher parasitic capacitance but only one or two periods may be needed due to the strong absorption of the absorbing region 709, such as when Ge or similar material is utilized, minimizing this disadvantage. While double heterostructure diodes are shown in FIG. 7, the disclosure is not so limited as other junctions are possible, such as homojunctions, a single heterojunction, or multiple junctions. Accordingly, the n-doped and p-doped regions alongside the Ge absorbing layer may comprise Ge for a homojunction, or Si for a heterojunction, for example.

Figure 8:
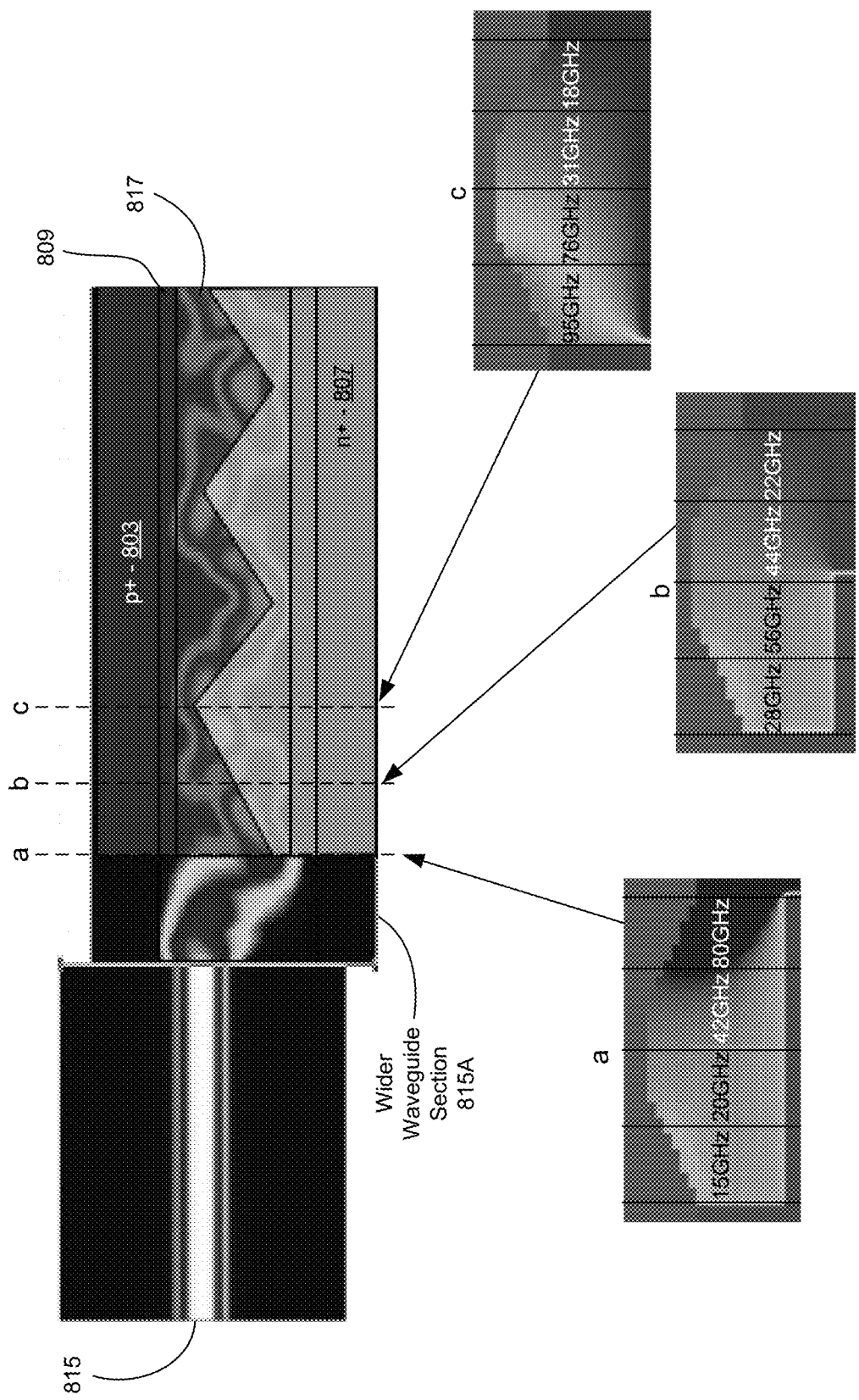
FIG. 8 illustrates bandwidth profiles along a variable junction location germanium photodiode, in accordance with an example embodiment of the disclosure.

FIG. 8 illustrates bandwidth profiles along a variable junction location photodiode, in accordance with an example embodiment of the disclosure. Referring to the top portion of FIG. 8, there is shown a top view of a photodiode where the width of the p-type and n-type silicon layers varies linearly in a zig-zag pattern to place the junction such that the high speed portion corresponds to the optical mode in the asymmetrically launched photodiode.

The lower portions of FIG. 8 illustrate the bandwidth for the photodiode in three locations a, b, and c, indicated by the dashed lines in the upper view, along the length where the PN junction location is changed. In an example scenario, Ge may be used for the absorbing region, although other materials are possible. The results show that the two absorbing portions near the PN junction have higher bandwidth than the other two. Therefore, by varying the junction location or doping profile such that it follows the bouncing path of the optical mode, the most carriers are generated in the higher speed portion along the propagation distance. This adaptive approach can be easily implemented by device layout. While a double heterostructure diode with Ge absorbing region and Si contact layers is shown in FIG. 8, the disclosure is not so limited as other junctions are possible, such as homojunctions, a single heterojunction, or multiple junctions. Accordingly, the n-doped and p-doped regions alongside the Ge absorbing layer may comprise Ge for a homojunction, or Si for a heterojunction, for example.

In an example embodiment of the disclosure, a method and system is described for selectively illuminated integrated photodetectors with launching and adaptive junction profile for bandwidth improvement. The method may comprise, in a photonic chip comprising an input waveguide and a photodiode, where the photodiode comprises an absorbing region with a p-doped region on a first side of the absorbing region and an n-doped region on a second side of the absorbing region: receiving an optical signal in the absorbing region via the input waveguide, which is offset to one side of a center axis of the absorbing region; and generating an electrical signal based on the received optical signal.

The first side of the absorbing region may be p-doped. The p-doped region on the first side of the absorbing region may be followed by an n-doped region on the first side along a length of the photodiode and the n-doped region on the second side of the absorbing region may be followed by a p-doped region along the length of the photodiode. The alternating p-doped and n-doped regions may repeat along the length of the photodiode. A junction at an interface between the p-doped layer and the n-doped region may form a zig-zag pattern along a length of the photodiode. A second waveguide may be between the absorbing region and the input waveguide and has a larger width than the input waveguide. The absorbing region may comprise germanium, silicon, silicon-germanium, or other semiconductor that absorbs light at a desired wavelength.

An optical power of the received optical signal may be at a maximum in a cross-section of the germanium layer near a junction formed by the n-doped region and the p-doped region. A location of maximum optical power in cross-sections of the photodiode may vary along a length of the photodiode. The optical signal may be received from the input waveguide as evanescent waves when the input waveguide is offset beyond an outer edge of the absorbing region. The photonic chip may comprise a complementary metal oxide semiconductor (CMOS) chip. The p-doped region and the n-doped region may comprise silicon, germanium, or other suitable semiconductor.

In another example embodiment of the disclosure, a method and system is described for selectively illuminated integrated photodetectors with configured launching and adaptive junction profile for bandwidth improvement. The system may comprise a photonic chip comprising an input waveguide and a semiconductor photodiode, where the semiconductor photodiode comprises a semiconductor absorbing region with a p-doped region on a first side of the semiconductor absorbing region and an n-doped region on a second side of the absorbing region. The semiconductor absorbing region may comprise silicon, germanium, silicon-germanium, or other material that absorbs optical signals of the desired wavelength. The photonic chip is operable to: receive an optical signal in the absorbing region via the input waveguide, which is offset to one side of a center axis of the absorbing region; and generate an electrical signal based on the received optical signal.

While the present disclosure has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for communication comprising:
propagating an optical signal along a first center axis of an input waveguide of a photonic chip, the first center axis extending along a first dimension;
receiving the optical signal in an absorbing region of a photodiode, the absorbing region having a second center axis extending along the first dimension, wherein the first center axis is offset from the second center axis along a second dimension different than the first dimension, wherein the photodiode further comprises a semiconductor layer arranged beneath the absorbing region and extending to opposing first and second sides of the absorbing region relative to the second dimension, wherein the semiconductor layer comprises one or more p-doped regions and one or more n-doped regions arranged such that, along an extent of the semiconductor layer in the first dimension, a location of a P-N junction of the semiconductor layer within the second dimension varies; and
generating an electrical signal based on the received optical signal.

2. The method according to claim 1, wherein the first side of the absorbing region is p-doped.

3. The method according to claim 1, wherein the semiconductor layer comprises:
a first plurality of doped regions extending to the first side of the absorbing region, wherein a first p-doped region of the one or more p-doped regions is followed in the first dimension by a first n-doped region of the one or more n-doped regions; and
a second plurality of doped regions extending to the second side of the absorbing region, wherein a second n-doped region of the one or more n-doped regions is followed in the first dimension by a second p-doped region of the one or more p-doped regions.

4. The method according to claim 3, wherein each of the first plurality of doped regions and the second plurality of doped regions comprises alternating p-doped and n-doped regions that repeat along the first dimension.

5. The method according to claim 1, wherein the P-N junction forms a zig-zag pattern along the first dimension.

6. The method according to claim 1, wherein the photonic chip further comprises:
a second waveguide arranged between the absorbing region and the input waveguide, wherein the second waveguide has a larger width in the second dimension than the input waveguide.

7. The method according to claim 1, wherein an optical power of the received optical signal is at a maximum in a cross-section of the semiconductor layer near the P-N junction.

8. The method according to claim 7, wherein a location of maximum optical power in cross-sections of the photodiode varies along a length of the photodiode in the first dimension.

9. The method according to claim 1, wherein receiving the optical signal comprises receiving evanescent waves when the input waveguide is offset beyond an outer edge of the absorbing region.

10. The method according to claim 1,
wherein the absorbing region comprises germanium, and
wherein the p-doped region and the n-doped region comprise one or both of silicon and germanium.

11. A system for communication, the system comprising:
a photonic chip comprising:
an input waveguide configured to propagate an optical signal along a first center axis, the first center axis extending along a first dimension; and
a photodiode comprising:
an absorbing region configured to receive the optical signal, the absorbing region having a second center axis extending along the first dimension, wherein the first center axis is offset from the second center axis along a second dimension different than the first dimension; and
a semiconductor layer arranged beneath the absorbing region and extending to opposing first and second sides of the absorbing region relative to the second dimension, wherein the semiconductor layer comprises one or more p-doped regions and one or more n-doped regions arranged such that, along an extent of the semiconductor layer in the first dimension, a location of a P-N junction of the semiconductor layer within the second dimension varies.

12. The system according to claim 11, wherein the first side of the absorbing region is p-doped.

13. The system according to claim 11, wherein the semiconductor layer comprises:
a first plurality of doped regions extending to the first side of the absorbing region, wherein a first p-doped region of the one or more p-doped regions is followed in the first dimension by a first n-doped region of the one or more n-doped regions; and
a second plurality of doped regions extending to the second side of the absorbing region, wherein a second n-doped region of the one or more n-doped regions is followed in the first dimension by a second p-doped region of the one or more p-doped regions.

14. The system according to claim 13, wherein each of the first plurality of doped regions and the second plurality of doped regions comprises alternating p-doped and n-doped regions that repeat along the first dimension.

15. The system according to claim 11, wherein the P-N junction forms a zig-zag pattern along the first dimension.

16. The system according to claim 11, wherein the photonic chip further comprises:
a second waveguide arranged between the absorbing region and the input waveguide, wherein the second waveguide has a larger width in the second dimension than the input waveguide.

17. The system according to claim 11, wherein an optical power of the received optical signal is at a maximum in a cross-section of the semiconductor layer near the P-N junction.

18. The system according to claim 17, wherein a location of maximum optical power in cross-sections of the photodiode varies along a length of the photodiode in the first dimension.

19. The system according to claim 11, wherein the photonic chip is operable to receive the optical signal from the input waveguide as evanescent waves when the input waveguide is offset beyond an outer edge of the absorbing region.

20. A method for communication comprising:
receiving, from an input waveguide having a first center axis extending along a first dimension, an optical signal in an absorbing region of a semiconductor photodiode, the absorbing region having a second center axis extending along the first dimension, wherein the first center axis is offset from the second center axis along a second dimension different than the first dimension, wherein the semiconductor photodiode further comprises a semiconductor layer arranged beneath the absorbing region and extending to opposing first and second sides of the absorbing region relative to the second dimension, wherein the semiconductor layer comprises one or more p-doped regions and one or more n-doped regions arranged such that, along an extent of the semiconductor layer in the first dimension, a location of a P-N junction of the semiconductor layer within the second dimension varies; and
generating an electrical signal based on the received optical signal.

* * * * *